(12) United States Patent
Mitsunari et al.

(10) Patent No.: US 11,721,557 B2
(45) Date of Patent: Aug. 8, 2023

(54) ETCHING METHOD

(71) Applicant: Tokyo Electron Limited, Tokyo (JP)

(72) Inventors: Tadashi Mitsunari, Nirasaki (JP); Naotaka Noro, Boise, ID (US); Tsuyoshi Moriya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/277,681

(22) PCT Filed: Sep. 25, 2019

(86) PCT No.: PCT/JP2019/037634
§ 371 (c)(1),
(2) Date: Mar. 18, 2021

(87) PCT Pub. No.: WO2020/067179
PCT Pub. Date: Apr. 2, 2020

(65) Prior Publication Data
US 2021/0351040 A1    Nov. 11, 2021

(30) Foreign Application Priority Data
Sep. 28, 2018  (JP) .................................. 2018-183319

(51) Int. Cl.
*H01L 21/311* (2006.01)
*H01J 37/32* (2006.01)

(52) U.S. Cl.
CPC ... *H01L 21/31116* (2013.01); *H01J 37/32091* (2013.01); *H01J 37/32724* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 7,416,989 B1 * | 8/2008 | Liu | H01L 21/02063 438/706 |
| 8,802,572 B2 * | 8/2014 | Nemani | H01L 21/31138 438/699 |

(Continued)

FOREIGN PATENT DOCUMENTS

JP    2015523734 A    8/2015

OTHER PUBLICATIONS

Kanarik et al., "Overview of atomic layer etching in the semiconductor industry", Journal of Vacuum Science & Technology A, 2015, vol. 33, No. 2, pp. 020802-1-020802-14.

(Continued)

*Primary Examiner* — Stephanie P Duclair
(74) *Attorney, Agent, or Firm* — Armstrong Teasdale LLP

(57) ABSTRACT

The etching method includes a modification process and a removal process. In the modification process, a fluorine containing gas is supplied to an object having a silicon oxide film, so that a modification layer is formed on the surface of the silicon oxide film. In the removal process, the object, on which the modification layer has been formed, is exposed to plasma of a gas that contains ammonia, so that the modification layer is removed from the object. In addition, the modification process and the removal process are alternately repeated a plurality of times.

8 Claims, 10 Drawing Sheets

(56) References Cited

U.S. PATENT DOCUMENTS

2017/0229314 A1* 8/2017 Tan .................... H01L 21/70
2018/0330962 A1* 11/2018 Tomita .............. H01L 21/67207

OTHER PUBLICATIONS

Tsutsumi et al., "Atomic layer etching of SiO2 by alternating an O2 plasma with fluorocarbon film deposition", Journal of Vacuum Science & Technology A: Vacuum, Surfaces, and Films, 2017, vol. 35, pp. 01A103-1-01A103-4.

* cited by examiner

ETCHING METHOD

CROSS-REFERENCE TO RELATED APPLICATIONS

This application is a National Stage Application of International Patent Application No. PCT/JP2019/037634, having an International Filing Date of Sep. 25, 2019, which claims the benefit of priority to Japanese Patent Application No. 2018-183319, filed Sep. 28, 2018, the entire contents of each of which are hereby incorporated by reference herein.

TECHNICAL FIELD

Various aspects and embodiments of the present disclosure relate to an etching method.

BACKGROUND

An atomic layer etching (ALE) method is known as one of semiconductor processing methods (see, for example, Non-Patent Document 1 below). In the ALE method, a first step of forming a modified layer on a surface of an object by causing molecules of an etchant gas to be adsorbed onto the surface of the object, and a second step of emitting ions to the object so as to remove the modified layer formed on the object are performed. When etching a silicon oxide film using the ALE method, in the first step, a CF-based modified layer is formed on the surface of a silicon oxide film using, for example, $Ar/C_4F_8$ plasma, and the formed modified layer is removed in the second step (see, for example, Non-Patent Document 2 below).

PRIOR ART DOCUMENTS

Non-Patent Documents (Non-Patent Document 1) Keren J. Kanarik, Thorsten Lill, Eric A. Hudson, Saravanapriyan Sriraman, Samantha Tan, Jeffrey Marks, Vahid Vahedi, and Richard A. Gottscho, "Overview of atomic layer etching in the semiconductor industry" Journal of Vacuum Science & Technology A 33, 020802 (2015); doi: 10.1116/1.4913379

(Non-Patent Document 2) Takayoshi Tsutsumi, Hiroki Kondo, Masaru Hori, Masaru Zaitsu, Akiko Kobayashi, Toshihisa Nozawa, and Nobuyoshi Kobayashi, "Atomic layer etching of $SiO_2$ by alternating an $O_2$ plasma with fluorocarbon film deposition" Journal of Vacuum Science & Technology A: Vacuum, Surfaces, and Films 35, 01A103 (2017)

The present disclosure provides an etching method capable of suppressing attachment of reaction byproducts (so-called deposition) attached onto inside of a chamber and reducing ionic damage to an object.

SUMMARY

An aspect of the present disclosure is an etching method, which includes a modification process and a removal process. In the modification process, a modified layer is formed on a surface of a silicon oxide film by supplying a fluorine containing gas to an object having the silicon oxide film. In the removal process, the modified layer is removed from the object by exposing the object having the modified layer formed thereon to plasma of an ammonia containing gas. In addition, the modification process and the removal process are alternately repeated a plurality of times.

According to various aspects and embodiments of the present disclosure, it is possible to suppress deposition attached onto inside of a chamber and to reduce ionic damage to an object.

DETAILED DESCRIPTION

Hereinafter, embodiments of an etching method disclosed herein will be described in detail with reference to the drawings. The etching method disclosed herein is not limited by the following embodiments.

Meanwhile, when $C_4F_8$ gas plasma is used, a CF-based polymer is formed as a deposition within a chamber and attaches onto an inner wall of the chamber. Therefore, in order to continue an etching process, it is necessary to clean the inside of the chamber on a regular basis in order to remove the deposition adhering to the inner wall of the chamber. Because the process is stopped while cleaning is being performed in the chamber, the throughput is reduced.

In addition, in the related art, in the second step, a modified layer on a surface of an object is removed by emitting ions of plasma to the object. However, some of the ions emitted to the object reach the object under the modified layer. When ions reach the object under the modified layer, a portion of the object other than the portion removed by etching is damaged by the impact of the ions.

Therefore, the present disclosure provides an etching technique capable of suppressing the deposition attached onto the inside the chamber and reducing ionic damage to the object.

[Configuration of Etching Apparatus 1]

Figure 1:
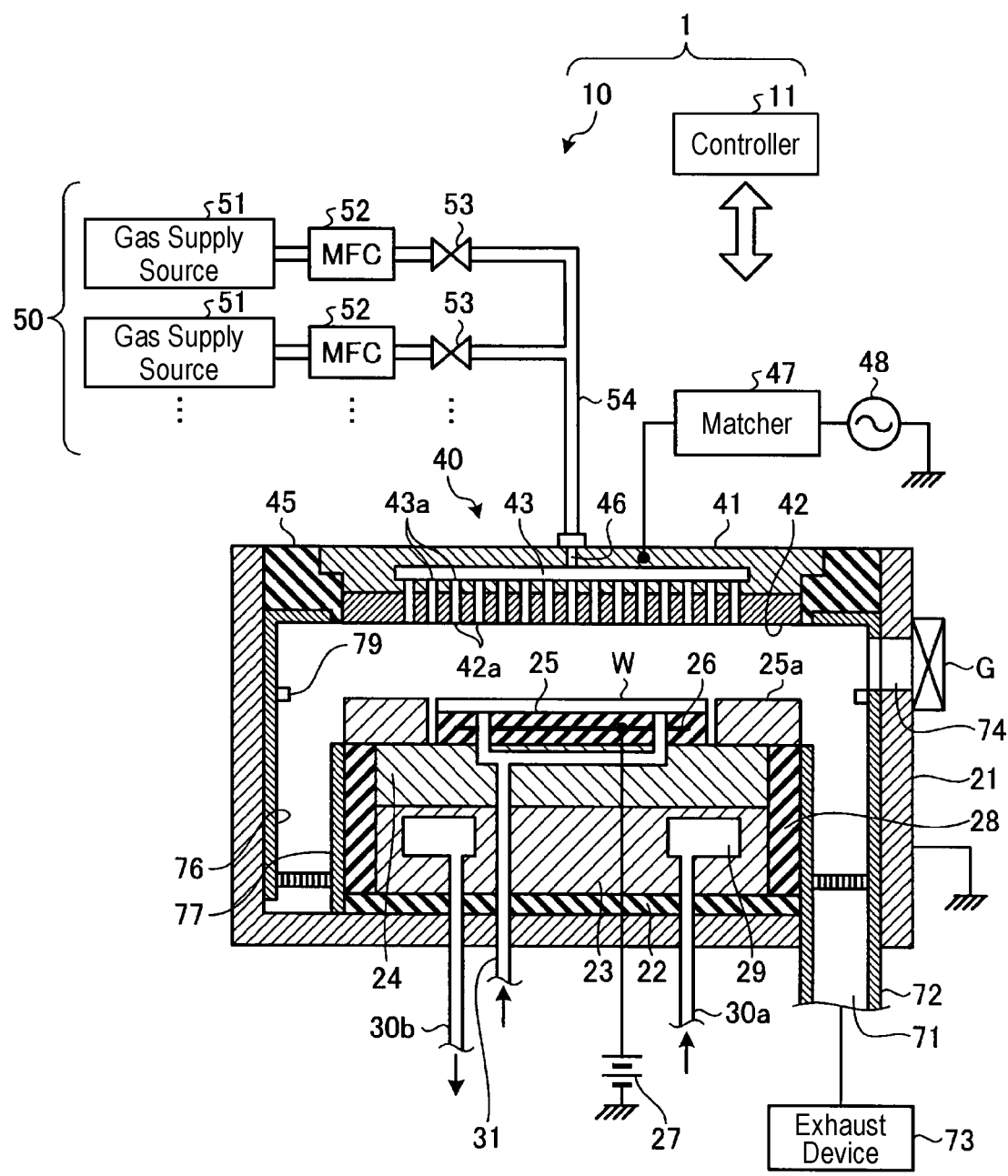
FIG. 1 is a schematic cross-sectional view illustrating an example of an etching apparatus according to an embodiment of the present disclosure.

FIG. 1 is a schematic cross-sectional view illustrating an example of an etching apparatus 1 according to an embodiment of the present disclosure. The etching apparatus 1 includes an apparatus body 10 and a controller 11. For example, as illustrated in FIG. 1, the apparatus body 10 includes a chamber 21 formed of aluminum or the like having an anodized surface, for example, and defining a substantially cylindrical processing space therein. The chamber 21 is grounded for safety. The chamber 21 in the present embodiment is configured as, for example, a capacitively coupled parallel plate plasma processing apparatus. In the chamber 21, a support base 23 is disposed via an insulating plate 22 formed of ceramic or the like. A susceptor 24 is provided on the support base 23. The support base 23 and the susceptor 24 are made of, for example, aluminum. The susceptor 24 functions as a lower electrode.

At a substantially central upper portion of the susceptor 24, an electrostatic chuck 25 configured to attract and hold an object W by an electrostatic force is provided. The electrostatic chuck 25 has a structure in which an electrode 26 formed of a conductive film or the like is sandwiched between a pair of insulating layers. A DC power supply 27 is electrically connected to the electrode 26. Further, the electrostatic chuck 25 is provided with a heater (not illustrated) configured to heat the object W.

On the upper portion of the susceptor 24, an edge ring 25a is arranged so as to surround the electrostatic chuck 25. Due to the edge ring 25a, uniformity of plasma in vicinity of an edge of the object W is improved. The edge ring 25a is formed of, for example, single crystal silicon. An inner wall member 28 is provided near the support base 23 and the susceptor 24 to surround the support base 23 and the susceptor 24. The inner wall member 28 is formed of, for example, quartz in a substantially cylindrical shape.

Inside the support base 23, for example, a flow path 29 is formed in a circumferential direction of the support base 23. In the flow path 29, a coolant controlled to a predetermined temperature is circulated and supplied from a chiller unit (not illustrated) provided outside through pipes 30a and 30b. By having the coolant circulating in the flow path 29, it is possible to cool the object W on the electrostatic chuck 25 by an exchange of heat with the coolant. Further, between a top surface of the electrostatic chuck 25 and a rear surface of the object W placed on the electrostatic chuck 25, a heat transfer gas which is supplied from a gas supply mechanism (not illustrated) is supplied through a pipe 31. The heat transfer gas is, for example, a helium gas. It is possible to adjust a temperature of the object W on the electrostatic chuck 25 to a predetermined temperature by using the coolant circulating in the flow path 29 and the heater provided on the electrostatic chuck 25.

Above the susceptor 24 functioning as the lower electrode, an upper electrode 40 is provided so as to face the susceptor 24 through a processing space in the chamber 21. A space located between the upper electrode 40 and the susceptor 24 and surrounded by the chamber 21 is the processing space in which the plasma is generated. The upper electrode 40 includes a ceiling plate 42 and a ceiling plate support 41 configured to support the ceiling plate 42.

The ceiling plate support 41 is supported in an upper portion of the chamber 21 via an insulating member 45. The ceiling plate support 41 is substantially disk-shaped and is formed of, for example, a conductive material having a relatively high thermal conductivity, such as aluminum or the like having an anodized surface. Further, the ceiling plate support 41 also functions as a heat dissipation plate, which dissipates the heat of the ceiling plate 42 heated by the plasma generated in the processing space. In the ceiling plate support 41, a gas inlet 46 through which a processing gas is introduced, a diffusion chamber 43 in which the processing gas introduced from the gas inlet 46 is diffused, and multiple flow ports 43a serving as flow paths through which the processing gas diffused in the diffusion chamber 43 flows downward, are formed.

The ceiling plate 42 is formed with a plurality of gas ejection ports 42a penetrating the ceiling plate 42 in a thickness direction of the ceiling plate 42. Each gas ejection port 42a is arranged to communicate with any of the flow ports 43a in the ceiling plate support 41. Thus, the processing gas supplied into the diffusion chamber 43 is supplied into the chamber 21 in a shower form through the flow ports 43a and the gas ejection ports 42a.

Further, a high-frequency power supply 48 is electrically connected to the upper electrode 40 via a matcher 47. The high-frequency power supply 48 applies high-frequency power having a frequency of 400 kHz to 100 MHz, for example, high-frequency power of 13.56 MHz, to the upper electrode 40 via the matcher 47. When the high-frequency power is applied to the upper electrode 40, the plasma of the processing gas is generated in the processing space between the upper electrode 40 and the susceptor 24. The magnitude and ON/OFF of the high-frequency power supplied from the high-frequency power supply 48 are controlled by the controller 11 to be described later.

A gas supply mechanism 50 is connected to the gas inlet 46 in the ceiling plate support 41 via a pipe 54. The gas supply mechanism 50 has a plurality of gas supply sources 51, a plurality of mass flow controllers (MFCs) 52, and a plurality of valves 53. The plurality of valves 53 are connected to the pipe 54. Further, one gas supply source 51 is connected to one valve 53 via one MFC 52. When the valve 53 is controlled to be in an open state, a flow rate of a gas supplied from a corresponding gas supply source 51 is controlled by the MFC 52, and the gas is supplied into the chamber 21 via the pipe 54.

In the embodiment, the gas supply mechanism 50 includes, for example, a gas supply source 51 which is a supply source of a fluorine containing gas, a gas supply source 51 which is a supply source of an ammonia ($NH_3$) gas, and a gas supply source which is a supply source of a purge gas 51. In the present embodiment, the fluorine containing gas is, for example, a $ClF_3$ gas. In the present embodiment, the purge gas is, for example, an Ar gas. The purge gas may be another rare gas or an inert gas such as a $N_2$ gas. The adjustment of a gas flow rate by each MFC 52 and opening and closing of each valve 53 are controlled by the controller 11 to be described later.

An exhaust port 71 is provided at the bottom of the chamber 21, and an exhaust device 73 is connected to the exhaust port 71 via an exhaust pipe 72. The exhaust device 73 includes, for example, a vacuum pump such as a dry pump (DP), a turbo molecular pump (TMP), or the like, and is capable of decreasing pressure within the chamber 21 to a desired pressure. The exhaust device 73 is controlled by the controller 11 to be described later.

An opening 74 through which carry-in and carry-out of an object W is performed is provided at a side wall of the chamber 21. The opening 74 is configured to be capable of being opened and closed by a gate valve G. In addition, on an inner wall of the chamber 21, a deposition shield 76 is detachably provided along a surface of the inner wall. Further, on an outer peripheral surface of the inner wall member 28, a deposition shield 77 is detachably provided along the outer peripheral surface of the inner wall member 28. The deposition shield 76 and the deposition shield 77 prevent deposition from adhering to the inner wall of the chamber 21 and the inner wall member 28. At a position on the deposition shield 76 having substantially the same height as that of the object W placed on the electrostatic chuck 25, a GND block 79 configured with a conductive member and connected to a ground is provided. The GND block 79 prevents abnormal discharge in the chamber 21.

The operation of the apparatus body 10 described above is controlled overall by the controller 11. The controller 11 has a memory such as a read only memory (ROM), a random access memory (RAM), or the like, a processor such as a central processing unit (CPU), a digital signal processor (DSP), or the like, and an input and output interface.

Control programs, processing recipes, or the like are stored in the memory. The processor reads a control program from the memory, executes the control program, and controls each part of the apparatus body 10 based on a recipe or the like stored in the memory via the input and output interface. As a result, the apparatus body 10 performs an etching process on an object W. Further, the control programs, the processing recipes, or the like in the memory may be used in a state of being stored in computer-readable recording media or the like. Alternatively, the control programs, processing recipes, or the like transmitted from another device, for example, via a communication line, may be used. The computer-readable recording media include, for example, a hard disk, a compact disc (CD), a digital versatile disc (DVD), a flexible disk, a semiconductor memory, and the like.

Here, in the present embodiment, an object W having a silicon oxide film is etched by the ALE method using the etching apparatus 1 illustrated in FIG. 1. In the ALE method of the present embodiment, first, a modification process of forming a modified layer on a surface of the silicon oxide film is executed by supplying a fluorine containing gas to the object W. Further, by exposing the object W on which the modified layer is formed to plasma of an ammonia containing gas, a removal process of removing the modified layer from the object W is executed. The modification process and the removal process are alternately repeated a plurality of times.

[Modification of Surface of Object W Using $ClF_3$ Gas]

Figure 2:
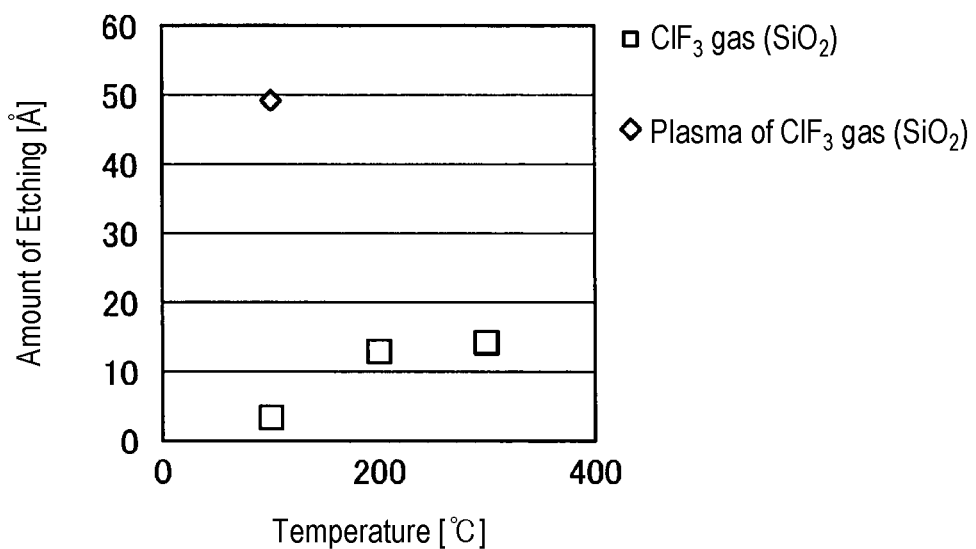
FIG. 2 is a diagram showing an example of an amount of etching with respect to a $ClF_3$ gas.

In the present embodiment, a thermal oxide film of $SiO_2$, for example, is used as an object W, and a $ClF_3$ gas, for example, is used as a fluorine containing gas. Here, when the object W of $SiO_2$ is exposed to the $ClF_3$ gas, an amount of etching is obtained as shown in FIG. 2, for example. FIG. 2 is a diagram showing an example of an amount of etching with respect to the $ClF_3$ gas. FIG. 2 also shows the amount of etching when the plasma of $ClF_3$ gas is used.

When the object W of $SiO_2$ is exposed to the $ClF_3$ gas, for example, as shown in FIG. 2, the object W is barely etched when a temperature of the object W is at any of 100 degrees C., 200 degrees C., and 300 degrees C.

Figure 3:
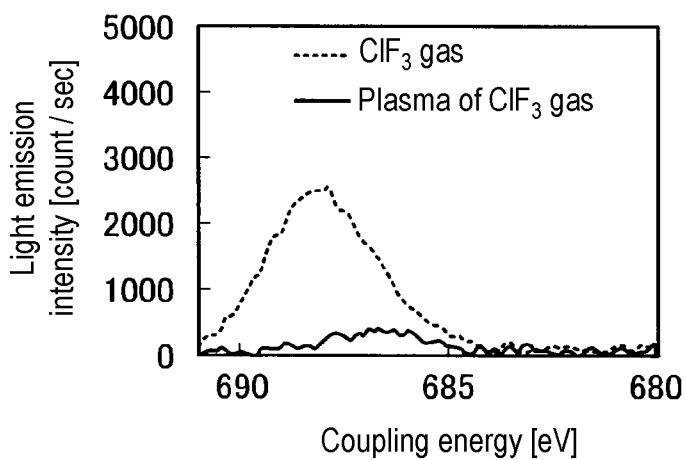
FIG. 3 is a diagram showing an example of results of X-ray photoelectron spectroscopy (XPS) analysis of an object of $SiO_2$.

Next, XPS analysis is performed on the object W after the object W is exposed to the $ClF_3$ gas and on the object W after the object W is exposed to the plasma of the $ClF_3$ gas, and accordingly, the results shown in FIG. 3, for example, are obtained. FIG. 3 is a diagram showing an example of results of the XPS analysis of the object W of $SiO_2$. FIG. 3 shows the results when the temperature of the object W is 100 degrees C.

For example, as shown in FIG. 3, a peak indicating fluorine bonding is observed in the object W exposed to the $ClF_3$ gas. On the other hand, for the object W exposed to the plasma of the $ClF_3$ gas, a peak showing the fluorine bonding is not observed. Generally, when an etchant gas containing fluorine (F) flows into the chamber 21, active fluorine atoms, radicals, and ions are generated due to collision of high-energy particles contained in plasma. When the modification process, which is the first process of the ALE, is performed using the plasma, a surface of the object W is etched because the activity is too high. In that case, there is a problem in that since self-saturating surface modification is not processed, etching uniformity is deteriorated. In contrast, by performing the surface modification using thermal treatment with exposure to the $ClF_3$ gas without using the plasma assist, in the modification process, it is possible to sufficiently fluorinate the surface of the object W while preventing the surface of the object W from being etched.

[Etching of Modified Surface of Object W Modified by $ClF_3$ Gas]

Next, an experiment was conducted regarding etching of a surface of an object W of $SiO_2$ modified with a $ClF_3$ gas. In the experiment, the ALE sequences A to G shown in FIGS. 4A to 4G were performed using the etching apparatus 1 illustrated in FIG. 1. In FIGS. 4A to 4G, a state of the valve 53 (an open state or a closed state) corresponding to the gas supply source 51 of each gas, and whether or not high-frequency power (hereinafter referred to as "RF") is applied to the upper electrode 40 (ON/OFF) are indicated.

In addition, FIGS. 4A to 4G show one of several cycles performed a plurality of times with respect to each ALE sequence. Further, in each of the ALE sequences shown in FIGS. 4A to 4G, an Ar gas, which is an example of an inert gas, is continuously supplied at a flow rate of 2,000 sccm. In addition, in each of the ALE sequences shown in FIGS. 4A to 4G, a flow rate of the $ClF_3$ gas is 500 sccm when the $ClF_3$ gas is supplied to the chamber 21. Furthermore, in each of the ALE sequences shown in FIGS. 4A to 4G, a temperature of objects W is 100 degrees C., and pressure in the chamber 21 is 1 Torr.

Figure 4A:
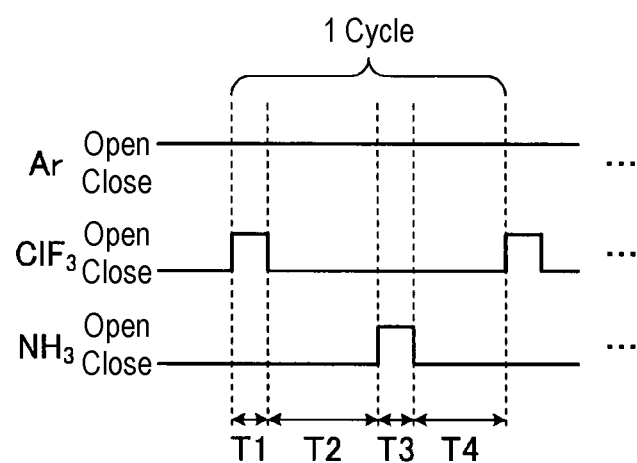
FIG. 4A is a diagram illustrating an example of an ALE sequence A.

FIG. 4A is a diagram illustrating an example of an ALE sequence A. In the ALE sequence A, the Ar gas and the $ClF_3$ gas are supplied into the chamber 21 in period T1, and the surface of the object W is purged by the Ar gas in period T2. Then, in period T3, the Ar gas and the $NH_3$ gas are supplied into the chamber 21, and in period T4, the surface of the object W is purged by the Ar gas. The flow rate of $NH_3$ gas in period T3 is 1,000 sccm.

Figure 4B:
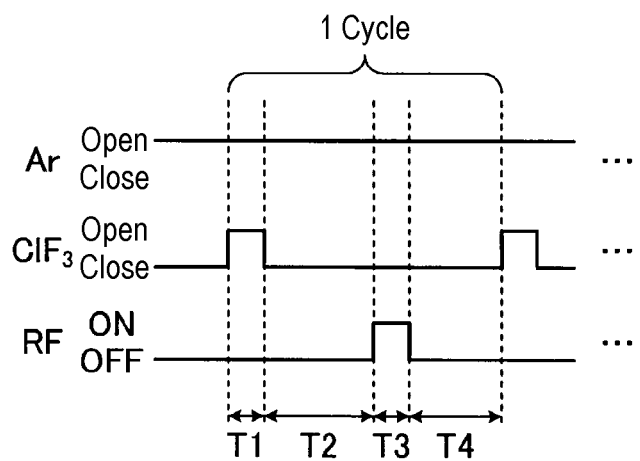
FIG. 4B is a diagram illustrating an example of an ALE sequence B.

FIG. 4B is a diagram illustrating an example of an ALE sequence B. In the ALE sequence B, the Ar gas and the $ClF_3$ gas are supplied into the chamber 21 in period T1, and the surface of the object W is purged by the Ar gas in period T2. Then, in period T3, high-frequency power is applied from the high-frequency power supply 48 to the upper electrode 40, and plasma of the Ar gas is generated in the chamber 21. The high-frequency power applied in period T3 is 300 W. Then, in period T4, the surface of the object W is purged by the Ar gas.

Figure 4C:
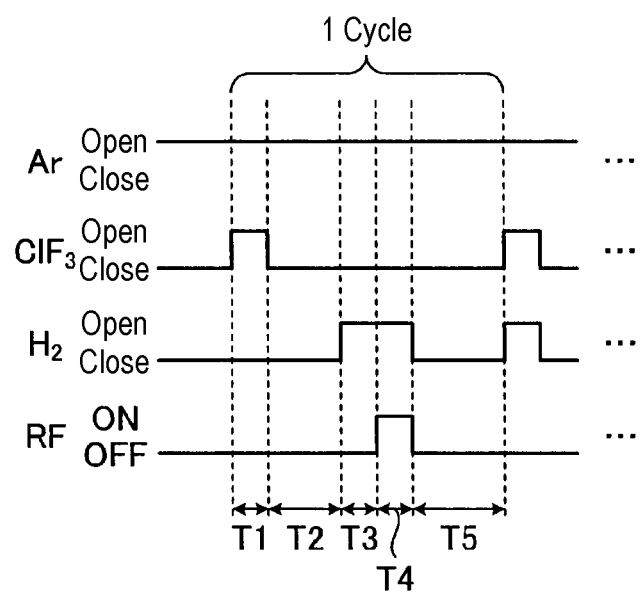
FIG. 4C is a diagram illustrating an example of an ALE sequence C.

FIG. 4C is a diagram illustrating an example of an ALE sequence C. In the ALE sequence C, the Ar gas and the $ClF_3$ gas are supplied into the chamber 21 in period T1, and the surface of the object W is purged by the Ar gas in period T2.

Then, the Ar gas and a $H_2$ gas are supplied into the chamber 21 in periods T3 and T4, and high-frequency power is applied from the high-frequency power supply 48 to the upper electrode 40 in period T4. As a result, in period T4, plasma of a mixed gas containing Ar gas and $H_2$ gas is generated in the chamber 21. The flow rate of the $H_2$ gas supplied into the chamber 21 in periods T3 and T4 is 500 sccm. The high-frequency power applied in period T4 is 300 W. Then, in period T5, the surface of the object W is purged by the Ar gas.

Figure 4D:
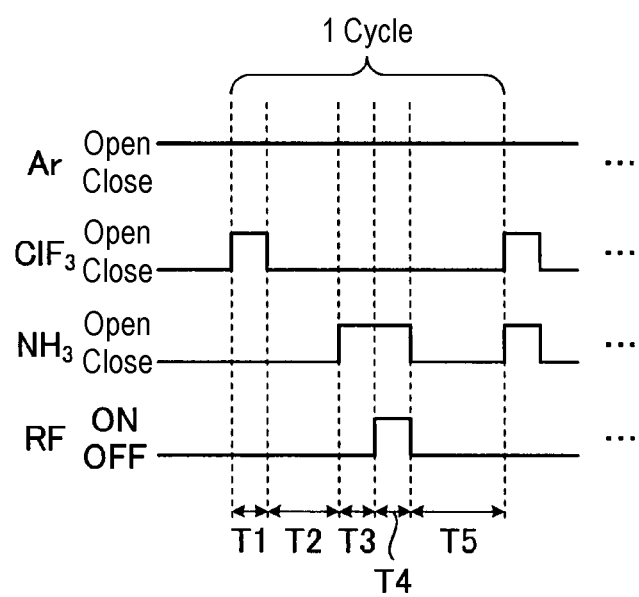
FIG. 4D is a diagram illustrating an example of an ALE sequence D.

FIG. 4D is a diagram illustrating an example of an ALE sequence D. In the ALE sequence D, the Ar gas and the $ClF_3$ gas are supplied into the chamber 21 in period T1, and the surface of the object W is purged by the Ar gas in period T2. Then, the Ar gas and the $NH_3$ gas are supplied into the chamber 21 in periods T3 and T4, and high-frequency power is applied from the high-frequency power supply 48 to the upper electrode 40 in period T4. As a result, in period T4, plasma of a mixed gas containing the Ar gas and the $NH_3$ gas is generated in the chamber 21. The flow rate of the $NH_3$ gas supplied into the chamber 21 in periods T3 and T4 is 1,000 sccm. The high-frequency power applied in period T4 is 300 W. Then, in period T5, the surface of the object W is purged by the Ar gas.

Figure 4E:
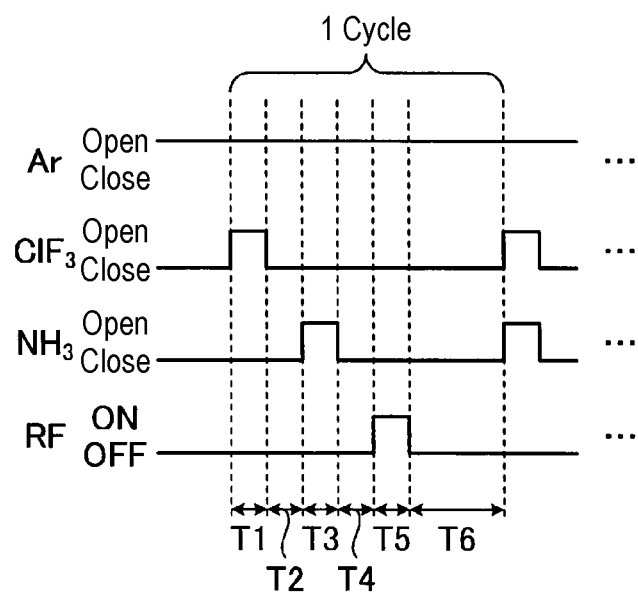
FIG. 4E is a diagram illustrating an example of an ALE sequence E.

FIG. 4E is a diagram illustrating an example of an ALE sequence E. In the ALE sequence E, the Ar gas and the $ClF_3$ gas are supplied into the chamber 21 in period T1, and the surface of the object W is purged by the Ar gas in period T2. Then, in period T3, the Ar gas and the $NH_3$ gas are supplied into the chamber 21, and in period T4, the surface of the object W is purged by the Ar gas. The flow rate of the $NH_3$ gas supplied into the chamber 21 in period T3 is 1,000 sccm. Then, in period T5, high-frequency power is applied from the high-frequency power supply 48 to the upper electrode 40, and plasma of the Ar gas is generated in the chamber 21. The high-frequency power applied in period T5 is 300 W. Then, in period T6, the surface of the object W is purged by the Ar gas.

Figure 4F:
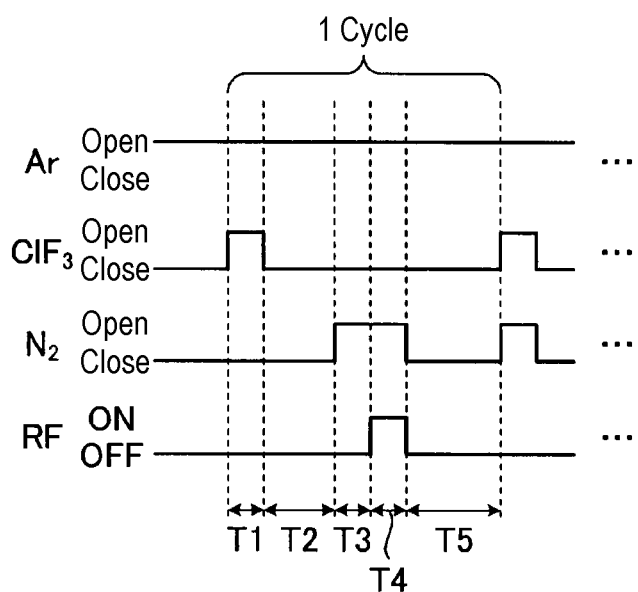
FIG. 4F is a diagram illustrating an example of an ALE sequence F.

FIG. 4F is a diagram illustrating an example of an ALE sequence F. In the ALE sequence F, the Ar gas and the $ClF_3$ gas are supplied into the chamber 21 in period T1, and the surface of the object W is purged by the Ar gas in period T2. Then, the Ar gas and a $N_2$ gas are supplied into the chamber 21 in periods T3 and T4, and high-frequency power is applied from the high-frequency power supply 48 to the upper electrode 40 in period T4. As a result, in period T4, plasma of a mixed gas containing the Ar gas and the $N_2$ gas is generated in the chamber 21. The flow rate of the $N_2$ gas supplied into the chamber 21 in periods T3 and T4 is 1,000 sccm. The high-frequency power applied in period T4 is 300 W. Then, in period T5, the surface of the object W is purged by the Ar gas.

Figure 4G:
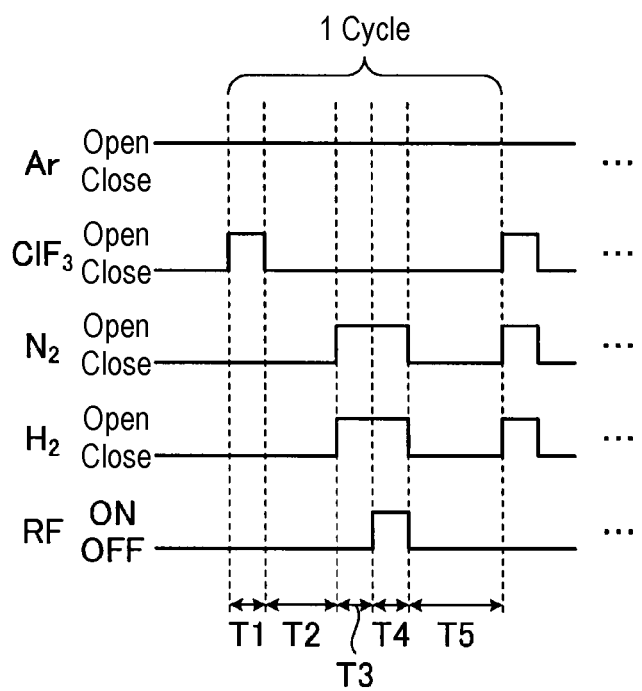
FIG. 4G is a diagram illustrating an example of an ALE sequence G.

FIG. 4G is a diagram illustrating an example of an ALE sequence G. In the ALE sequence G, the Ar gas and the $ClF_3$ gas are supplied into the chamber 21 in period T1, and the surface of the object W is purged by the Ar gas in period T2. Then, the Ar gas, the $N_2$ gas, and the $H_2$ gas are supplied into the chamber 21 in periods T3 and T4, and high-frequency power is applied from the high-frequency power supply 48 to the upper electrode 40 in period T4. As a result, in period T4, plasma of a mixed gas containing the Ar gas, the $N_2$ gas, and the $H_2$ gas is generated in the chamber 21. The flow rate of each of the $N_2$ gas and the $H_2$ gas supplied into the chamber 21 in periods T3 and T4 is 500 sccm. The high-frequency power applied in period T4 is 300 W. Then, in period T5, the surface of the object W is purged by the Ar gas.

Figure 5:
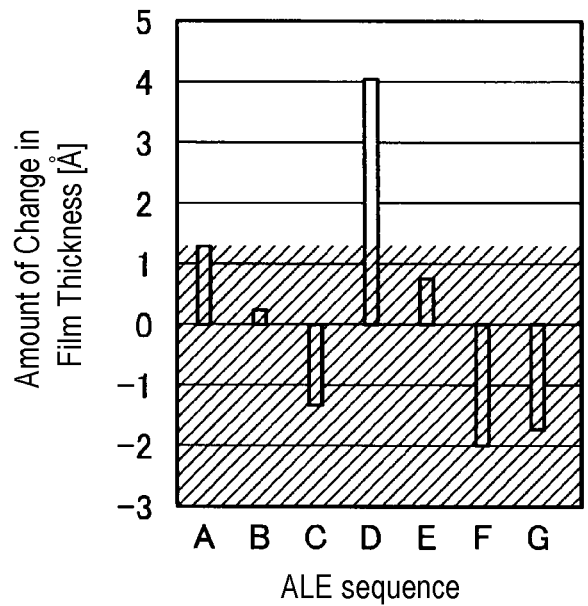
FIG. 5 is a diagram showing an example of an amount of change in film thickness of an object in each ALE sequence.

FIG. 5 is a diagram showing an example of an amount of change in film thickness of the object W in each ALE sequence. An amount of change in the film thickness in each ALE sequence shown in FIG. 5 indicates a difference between a film thickness of the object W before etching and a film thickness of the object W after repeating the ALE sequence for 10 cycles. That is, when the object W is etched, the amount of change in the film thickness becomes a positive value. On the other hand, when the film thickness increases, the amount of change in the film thickness becomes a negative value.

In each of the ALE sequences C, F, and G, the amount of change in the film thickness is a negative value and thus, the object W is not etched. In each of the ALE sequences A, B, and E, the value of the amount of change in the film thickness is 1 Å or less even if the ALE sequence is repeated for 10 cycles and thus, the object W is barely etched.

In contrast, in the ALE sequence D, the amount of change in the film thickness is about 4 Å when the ALE sequence D is repeated for 10 cycles and thus, the object W is etched. Therefore, among the ALE sequences A to G, the ALE sequence D is the preferred ALE sequence. In the following, a different experiment was performed on the ALE sequence D.

Here, an etching mechanism of the object W by the ALE sequence D is considered to be as follows. In the ALE sequence D, as shown in FIG. 4D, the $ClF_3$ gas is supplied to the object W of $SiO_2$ in period T1, the surface of the object W is fluorinated, and a modified layer is formed (modification process). Then, in period T2, the surface of the object W is purged with the Ar gas, and thus, molecules of the $ClF_3$ gas excessively attached to the object W are removed (first purging process).

Then, in period T3, the $NH_3$ gas is supplied into the chamber 21, and in period T4, plasma of a mixed gas containing the Ar gas and the $NH_3$ gas is generated. Further, active species contained in the plasma are emitted to the modified layer, which is a fluoride of $SiO_2$, and thus, the modified layer changes to $(NH_4)_2SiF_6$ (ammonium fluorosilicate), $O_2$, or the like. Since the sublimation temperature of ammonium fluorosilicate is about 100 degrees C. and the temperature of the object W is maintained at a temperature of 100 degrees C. or higher, ammonium fluorosilicate is turned into a gas and separates from the surface of the object W. As a result, the modified layer is removed from the surface of the object W, and the object W is etched (removal process). Then, in period T5, the surface of the object W is purged with the Ar gas, and thus, an ammonium fluorosilicate gas or the like in vicinity of the surface of the object W is exhausted (second purging process).

Here, in the removal process of the ALE sequence D, the active species contained in the plasma are emitted to the modified layer, which is a fluoride of $SiO_2$, and thus, the modified layer is turned into ammonium fluorosilicate or the like. Therefore, an amount of ions colliding with the object W is smaller than that in the conventional ALE removal process in which high-energy ions are emitted to the modified layer and thus, the modified layer is bounced off by the impact of the ions. As a result, in the removal process in the ALE sequence D, it is possible to reduce ionic damage to the object W compared with the conventional ALE removal process.

Further, in the modification process in the ALE sequence D, the modified layer, which is a fluoride of $SiO_2$, is formed on the surface of the object W by the thermal reaction of the $ClF_3$ gas. Therefore, the amount of deposition adhering to the inner wall of the chamber 21 in the modification process in the ALE sequence D is small compared with that in the conventional modification process of ALE in which the modified layer is formed on the surface of the object W using plasma of a CF-based gas. Therefore, since it is possible to lengthen a period for cleaning the inside of the chamber 21, the throughput of the process can be improved.

[Dependence of Amount of Etching on Plasma Emission Time]

Figure 6:
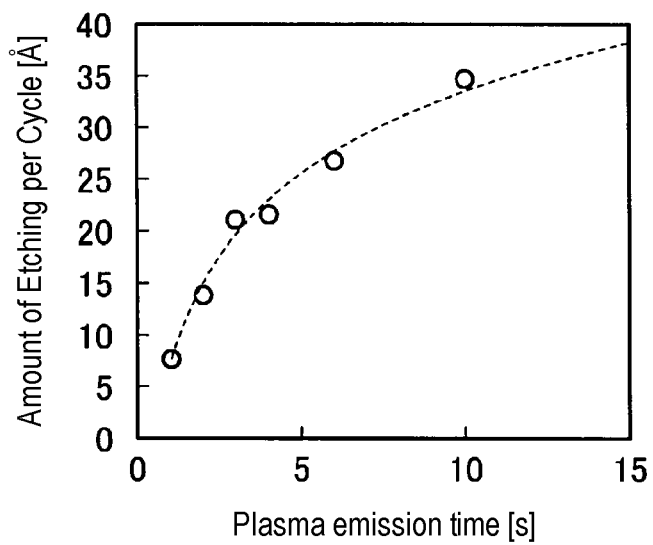
FIG. 6 is a diagram showing an example of a relationship between a plasma emission time and an amount of etching per cycle.

FIG. 6 is a diagram showing an example of a relationship between a plasma emission time and an amount of etching per cycle. In an experiment of FIG. 6, for the ALE sequence D, period T1 is set to 4 seconds, period T2 is set to 2 seconds, period T3 is set to 1 second, and period T5 is set to 10 seconds. In addition, a temperature of the object W is set to 100 degrees C. The high-frequency power applied in period T4 is 300 W.

As shown in FIG. 6, as the emission time of the plasma of the mixed gas containing the Ar gas and the $NH_3$ gas to the object W, that is, period T4 increases, the amount of etching of the object W per cycle tends to increase. Further, as the plasma emission time increases, the amount of change in the amount of etching of the object W per cycle tends to decrease with respect to the amount of change in the plasma emission time.

[Dependence of Amount of Etching on $ClF_3$ Gas Supply Time]

Figure 7:
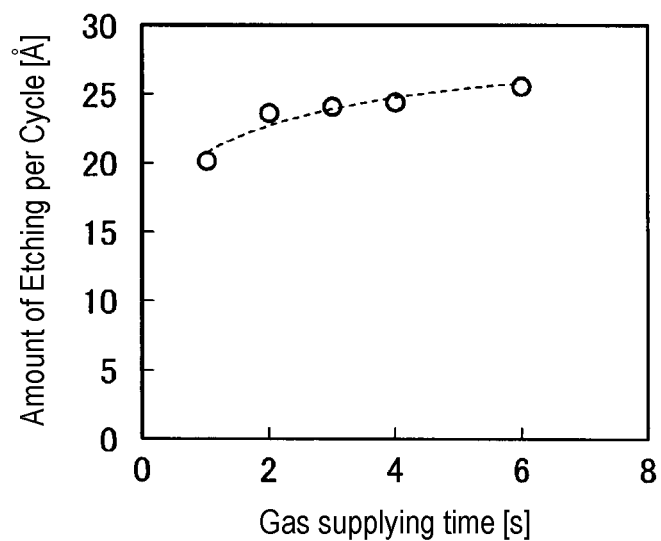
FIG. 7 is a diagram showing an example of a relationship between a supply time of a $ClF_3$ gas and an amount of etching per cycle.

FIG. 7 is a diagram showing an example of a relationship between a supply time of a $ClF_3$ gas and an amount of etching per cycle. In an experiment of FIG. 7, for the ALE sequence D, period T2 is set to 2 seconds, period T3 is set to 1 second, period T4 is set to 2 seconds, and period T5 is set to 10 seconds. Further, the temperature of the object W is set to 100 degrees C. The high-frequency power applied in period T4 is 300 W.

For example, as shown in FIG. 7, when the $ClF_3$ gas supply time, that is, period T1 increases, the amount of etching of the object W per cycle tends to increase. However, when period T1 is set to 2 seconds or more, the amount of etching of the object W per cycle hardly changes. That is, when period T1 in which the $ClF_3$ gas is supplied is 2 seconds or more, it is considered that the surface of the object W is sufficiently fluorinated.

[Dependence of Amount of Etching on ALE Cycle]

Figure 8:
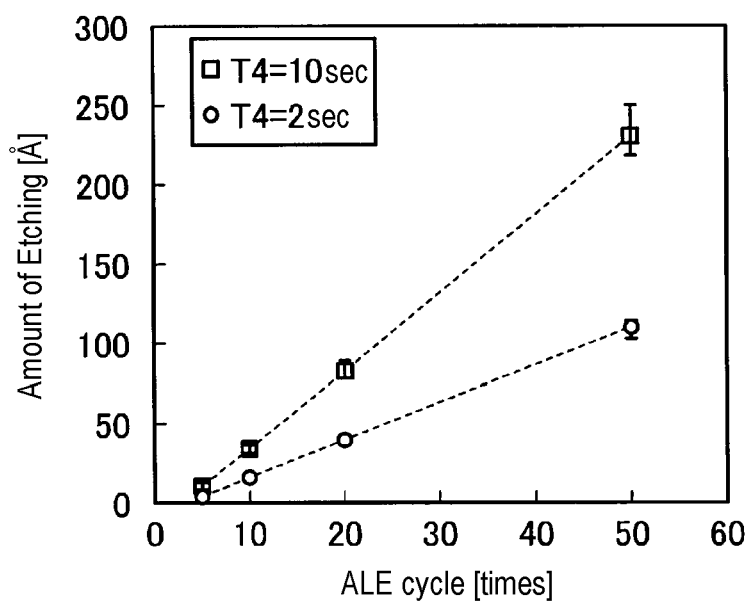
FIG. 8 is a diagram showing an example of a relationship between an ALE cycle and an amount of etching.

FIG. 8 is a diagram showing an example of a relationship between an ALE cycle and an amount of etching. In an experiment of FIG. 8, for the ALE sequence D, period T1 is set to 2 seconds, period T2 is set to 2 seconds, period T3 is set to 1 second, and period T5 is set to 10 seconds. In addition, the temperature of the object W is set to 100 degrees C. The high-frequency power applied in period T4 is 300 W.

As shown in FIG. 8, when period T4 in which the plasma of the mixed gas containing the Ar gas and the $NH_3$ gas is emitted to the object W is longer, the amount of etching is generally greater than that in the case when period T4 is shorter. However, regardless of the length of period T4, the amount of etching changes linearly with the change in the number of ALE cycles. Therefore, in the ALE sequence D, it is possible to control the amount of etching with high accuracy by controlling the number of ALE cycles. In addition, by shortening period T4 in which the plasma of the mixed gas containing the Ar gas and the $NH_3$ gas is emitted to the object W, it is possible to control the amount of etching with higher accuracy.

[Dependence of Etching Rate on Temperature]

Figure 9:
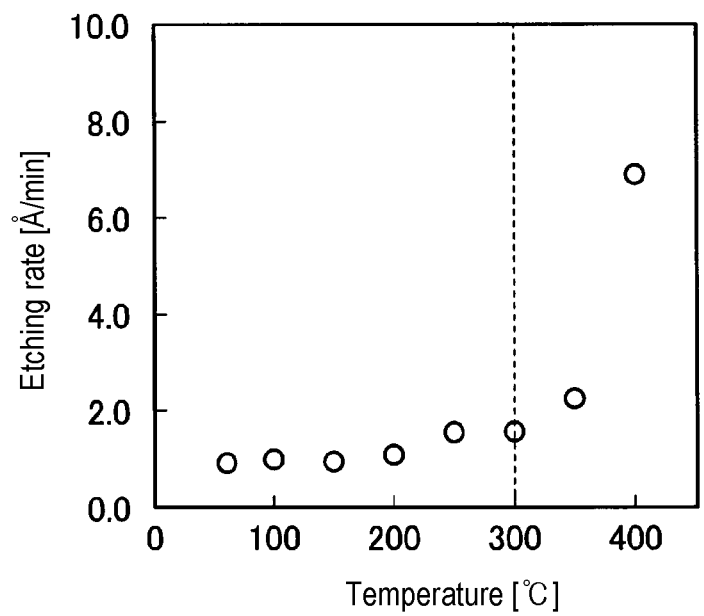
FIG. 9 is a diagram showing an example of a relationship between a temperature of an object and an etching rate.

FIG. 9 is a diagram showing an example of a relationship between a temperature and an etching rate of an object W. In FIG. 9, for the object W at each temperature, the amount of etching of the object W is measured by supplying the $ClF_3$ gas to the object W. The flow rate of the $ClF_3$ gas supplied in the experiment of FIG. 9 is 500 sccm.

For example, as shown in FIG. 9, when a temperature of the object W is 300 degrees C. or lower, the object W is barely etched. However, when the temperature of the object W becomes 350 degrees C. or higher, the etching of the object W progresses when the $ClF_3$ gas is supplied to the surface of the object W. When the object W is etched by the supply of the $ClF_3$ gas, a correlation between the ALE cycle and the amount of etching is broken, and it becomes difficult to control the amount of etching. Therefore, it is preferable that the amount of etching of the object W by the supply of $ClF_3$ gas is small. Therefore, the temperature of the object W is preferably 300 degrees C. or lower.

Figure 10:
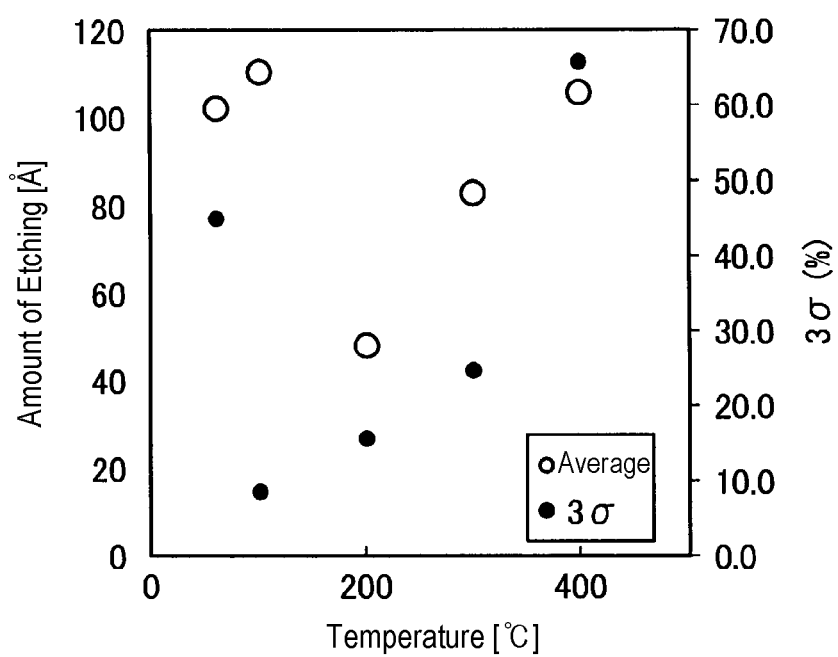
FIG. 10 is a diagram showing an example of a relationship between a temperature of an object and an amount of etching in the ALE sequence D.

FIG. 10 is a diagram showing an example of a relationship between a temperature of an object W and an amount of etching in the ALE sequence D. In FIG. 10, period T1 in the ALE sequence D is set to 2 seconds, period T2 is set to 2 seconds, period T3 is set to 1 second, period T4 is set to 4 seconds, and period T5 is set to 10 seconds. The flow rate of $ClF_3$ gas supplied in period T1 is 500 sccm, and the flow rate of $NH_3$ gas supplied in periods T3 and T4 is 1000 sccm. The high-frequency power applied in period T4 is 300 W.

For example, as shown in FIG. 10, a value of 3σ, which indicates a degree of variation in the amount of etching of the object W, is as small as less than 25% when the temperature of the object W is within a range of 100 degrees C. or higher and 300 degrees C. or lower. On the other hand, when the temperature of the object W is 400 degrees C. or higher, the value of 3σ is as large as 65% or higher. In addition, even when the temperature of the object W is 50 degrees C. or lower, the value of 3σ is as large as 45% or more. Therefore, when the temperature of the object W is within the range of 100 degrees C. or higher and 300 degrees C. or lower, it is possible to reduce the variation in the amount of etching of the object W. Therefore, the temperature of the object W is preferably in the range of 100 degrees C. or higher and 300 degrees C. or lower.

Summarizing the above results, the etching of an object W of $SiO_2$ is preferably performed in accordance with the ALE sequence D, and the main conditions of the ALE sequence D are as follows.

Temperature of object W: 100 degrees C. to 300 degrees C.
Pressure within chamber 21: 0.5 to 10 Torr
Flow rate of $ClF_3$ gas: 1 to 1,000 sccm
Flow rate of $NH_3$ gas: 100 to 2,000 sccm
Flow rate of Ar gas: 0 to 10,000 sccm
RF power: 100 to 1,000 W
Ar gas does not have to be supplied during a period other than the purging period.

[Etching Method]

Figure 11:
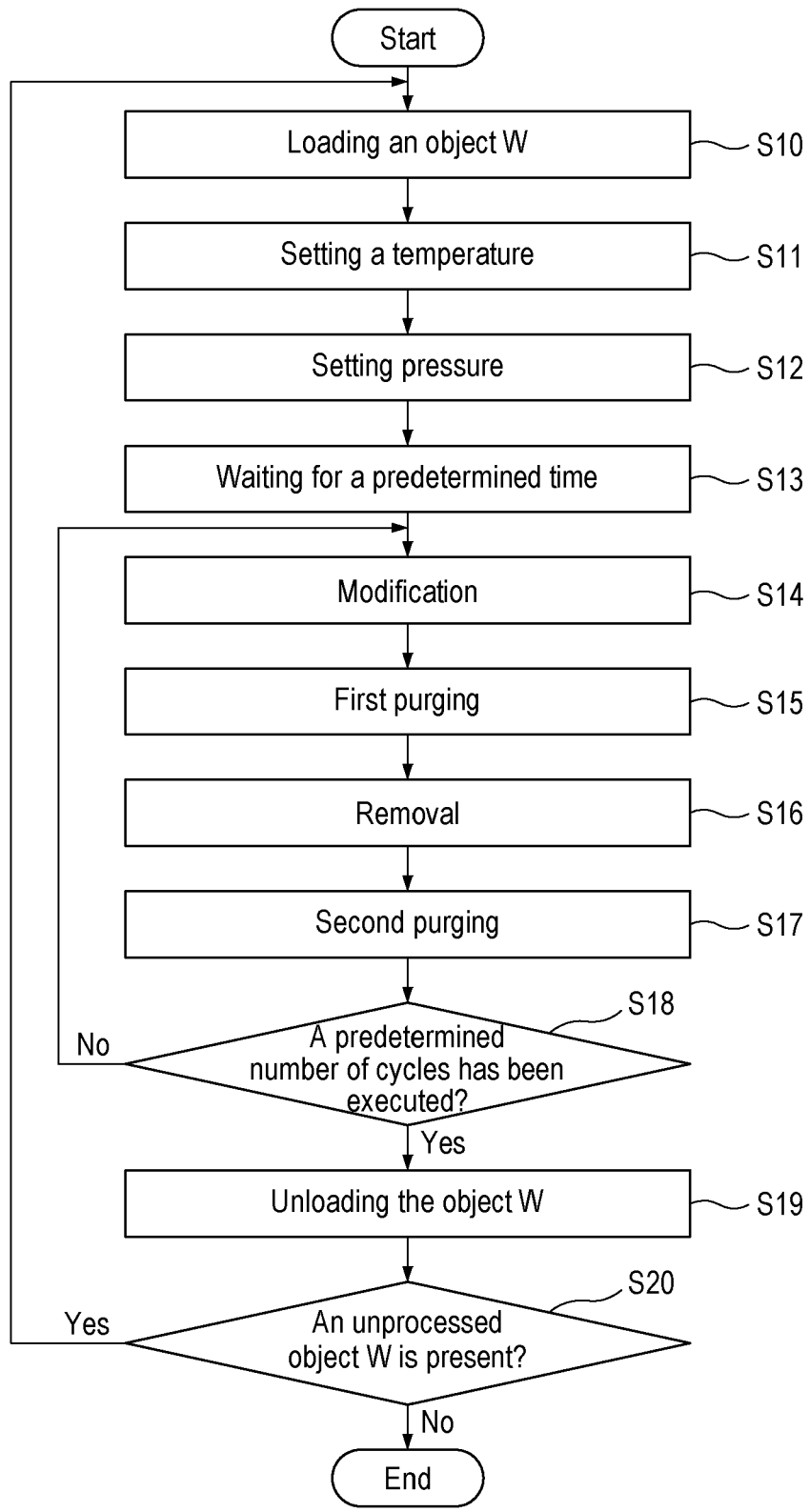
FIG. 11 is a flowchart illustrating an example of an etching method according to an embodiment of the present disclosure.

FIG. 11 is a flowchart illustrating an example of an etching method according to an embodiment of the present disclosure. The etching method illustrated in FIG. 11 is executed by controlling each part of the apparatus body 10 by the controller 11. The etching method illustrated in FIG. 11 corresponds to the ALE sequence D shown in FIG. 4D.

First, the gate valve G is opened, and an unprocessed object W is carried into the chamber 21 through the opening 74 by a robot arm (not illustrated) and placed on the electrostatic chuck 25 (S10). Then, the gate valve G is closed. Further, the controller 11 controls the heater (not illustrated) provided in the electrostatic chuck 25 and the chiller unit (not illustrated) to set a temperature of the object W to a predetermined temperature (S11).

Next, the controller 11 opens the valve 53 corresponding to the gas supply source 51 that supplies an Ar gas, and drives the exhaust device 73 to set the pressure in the chamber 21 to a predetermined pressure (S12). Further, the controller 11 waits for a predetermined time until the temperature of the object W and the pressure within the chamber 21 are stabilized (S13).

Then, the controller 11 executes the modification process (S14). In the modification process, the valve 53 corresponding to the gas supply source 51 for supplying a $ClF_3$ gas is opened. Then, the $ClF_3$ gas and the Ar gas, the flow rate of each of which is adjusted to a predetermined flow rate by the MFC 52, are respectively supplied into the chamber 21. As a result, a surface of the object W is fluorinated, and a modified layer is formed on the surface of the object W. In the present embodiment, the modification process of step S14 is executed, for example, for 4 seconds.

Next, the controller 11 executes a first purging process (S15). In the first purging process, the valve 53 corresponding to the gas supply source 51 for supplying the $ClF_3$ gas is closed, and the Ar gas, the flow rate of which is adjusted to a predetermined flow rate by the MFC 52, is supplied into the chamber 21. As a result, molecules of the $ClF_3$ gas that are excessively attached to the object W, atoms of Cl that do not contribute to fluorination, and the like are removed. The first purging process of step S15 is executed, for example, for 2 seconds.

Then, the controller 11 executes a removal process (S16). In the removal process, the valve 53 corresponding to the gas supply source 51 for supplying a $NH_3$ gas is opened. Further, the $NH_3$ gas and the Ar gas, the flow rate of each of which is adjusted to a predetermined flow rate by the MFC 52, are respectively supplied into the chamber 21.

Then, by applying high-frequency power from the high-frequency power supply 48 to the upper electrode 40, plasma of a mixed gas containing the Ar gas and the $NH_3$ gas is generated within the chamber 21. Further, when the active species contained in the plasma are emitted to the modified layer formed on the surface of the object W in step S14, the modified layer is changed to ammonium fluorosilicate, $O_2$, or the like. Then, the ammonium fluorosilicate, $O_2$, or the like is separated from the surface of the object W by vaporization and thus, the modified layer is removed from the surface of the object W. In step S16, the emission of the plasma of the mixed gas containing the Ar gas and the $NH_3$ gas is performed, for example, for 4 seconds.

Next, the controller 11 executes a second purging process (S17). In the second purging process, the application of the high-frequency power from the high-frequency power supply 48 to the upper electrode 40 is stopped, and the valve 53 corresponding to the gas supply source 51 for supplying the $NH_3$ gas is closed. Then, the Ar gas, the flow rate of which is adjusted to a predetermined flow rate by the MFC 52, is supplied into the chamber 21. As a result, the ammonium fluorosilicate gas or the like in the vicinity of the surface of the object W is exhausted. The second purging process of step S17 is executed, for example, for 10 seconds.

Then, the controller 11 closes the valve 53 corresponding to the gas supply source 51 for supplying the Ar gas, and determines whether steps S14 to S17 have been executed for a predetermined number of cycles (S18). The predetermined number of cycles is determined in advance depending on the thickness of a member to be removed from the object W by etching. When steps S14 to S17 have not been executed for the predetermined number of cycles (S18: "No"), the controller 11 executes the illustrated process in step S14 again.

On the other hand, when steps S14 to S17 have been executed for the predetermined number of cycles (S18: "Yes"), the gate valve G is opened, and the object W is carried out from the chamber 21 through the opening 74 by a robot arm (not illustrated) (S19). Then, the controller 11 determines whether an unprocessed object W is present (S20). When the unprocessed object W is present (S20: "Yes"), the controller 11 executes the process illustrated in step S10. However, when the unprocessed object W is not present (S20: "No"), the controller 11 terminates the etching method illustrated in the flowchart.

The embodiment of the etching method has been described above. The etching method in the present embodiment includes the modification process and the removal process. In the modification process, the fluorine containing gas, such as the $ClF_3$ gas, is supplied to the object W having the $SiO_2$ film and thus, the modified layer is formed on the surface of the $SiO_2$. In the removal process, the object W on which the modified layer is formed is exposed to the plasma of the ammonia containing gas, and thus, the modified layer is removed from the object W. Further, the modification process and the removal process are alternately repeated a plurality of times. As a result, it is possible to suppress deposition attached onto the inside of the chamber 21 and thus, it is possible to reduce ionic damage to the object W.

Further, the temperature of the object W in the modification process and the removal process of the above-described embodiment is a temperature within a range of 100 degrees C. or higher and 300 degrees C. or lower. As a result, it is possible to fluorinate the surface of the object W without etching the object W in the modification process. Further, it is possible to suppress the variation in the amount of etching to a low level in the removal process.

Further, the etching method of the above-described embodiment further includes a first purging process which is performed between the modification process and the removal process and which purges the surface of the object W using an inert gas. As a result, it is possible to remove molecules of the $ClF_3$ gas that are excessively attached to the object W, the atoms of Cl that do not contribute to the fluorination, or the like.

Further, the etching method of the above-described embodiment further includes a second purging process which is performed between the removal process and the modification process and which purges the surface of the object W using an inert gas. As a result, the ammonium fluorosilicate gas or the like generated in the removal process is exhausted from vicinity of the surface of the object W, and the surface of the object W is efficiently fluorinated in the next modification process.

[Others]

The technology disclosed herein is not limited to the embodiment described above, and various modifications are possible within the scope of the gist the present disclosure.

For example, in the modification process of the above-described embodiment, the $ClF_3$ gas is supplied into the chamber 21, but the technique disclosed herein is not limited thereto. The gas supplied into the chamber 21 in the modification process may be a gas containing at least one of $ClF_3$ gas, HF gas, $CHF_3$ gas, or $CH_3F$ gas, as long as the gas is a fluorine containing gas.

Further, in the etching method of the above-described embodiment, a silicon oxide film, such as a $SiO_2$ film is etched, but the technique disclosed herein is not limited thereto. For example, the technique disclosed herein is applicable to etching of an object W having a silicon containing film other than the silicon oxide film, such as a SiN film. However, in that case, an oxidation process of oxidizing a surface of the silicon containing film is further executed before the modification process of step S14. Therefore, in the modification process, the modified layer, which is a fluoride film, is formed on the surface of the object W, and in the removal process, it is possible to change the modified layer to ammonium fluorosilicate or the like and sublimate the ammonium fluorosilicate or the like.

Further, in the removal process of the embodiment described above, the capacitively coupled plasma (CCP) is used as an example of the plasma source, but the technique disclosed herein is not limited thereto, and the removal process that uses a plasma source other than the capacitively coupled plasma may be performed. Examples of plasma sources other than the capacitively coupled plasma include inductively coupled plasma (ICP), microwave-excited surface-wave plasma (SWP), electron cyclotron resonance plasma (ECP), and helicon-wave-excited plasma (HWP).

It should be understood that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

EXPLANATION OF REFERENCE NUMERALS

G: gate valve, W: object, 1: etching apparatus, 10: apparatus body, 11: controller, 21: chamber, 24: susceptor, 25: electrostatic chuck, 25a: edge ring, 40: upper electrode, 41: ceiling plate support, 42: ceiling plate, 42a: gas ejection port, 43: diffusion chamber, 47: matcher, 48: high-frequency power supply, 50: gas supply mechanism

What is claimed is:

1. A method of etching, comprising:
   forming a modified layer on a surface of a silicon oxide film by supplying a fluorine containing gas without plasma of the fluorine containing gas to an object including the silicon oxide film and thermally reacting the surface of the silicon oxide film with the fluorine containing gas; and
   removing the modified layer from the object by exposing the object with the modified layer formed thereon to plasma of an ammonia containing gas that does not contain a halogen element,
   wherein forming the modified layer and removing the modified layer are alternately repeated a plurality of times, and
   wherein a temperature of the object in forming the modified layer and removing the modified layer falls within a range of 100 degrees C. or higher and 300 degrees C. or lower.

2. The method of claim 1, wherein the fluorine containing gas contains at least one or more of a ClF3 gas, a HF gas, a CHF3 gas, or a CH3F gas.

3. The method of claim 2, further comprising:
   oxidizing a surface of the object containing silicon to form the silicon oxide film on the surface of the object, wherein oxidizing the surface of the object is performed before forming the modified layer.

4. The method of claim 3, further comprising:
   a first purging of the surface of the object using a first inert gas, wherein the first purging is performed between forming the modified layer and removing the modified layer.

5. The method of claim 4, further comprising:
   a second purging of the surface of the object using a second inert gas, wherein the second purging is performed between removing the modified layer and forming the modified layer.

6. The method of claim 1, further comprising:
   oxidizing a surface of the object containing silicon to form the silicon oxide film on the surface of the object, wherein oxidizing the surface of the object is performed before forming the modified layer.

7. The method of claim 1, further comprising:
   a first purging of the surface of the object using a first inert gas, wherein the first purging is performed between forming the modified layer and removing the modified layer.

8. The method of claim 1, further comprising:
   a second purging of the surface of the object using a second inert gas, wherein the second purging is performed between removing the modified layer and forming the modified layer.

* * * * *